(12) United States Patent
Josberger et al.

(10) Patent No.: US 10,332,923 B2
(45) Date of Patent: Jun. 25, 2019

(54) CONTROL CIRCUITRY FOR 1D OPTICAL METASURFACES

(71) Applicant: Elwha LLC, Bellevue, WA (US)

(72) Inventors: Erik E. Josberger, Seattle, WA (US); Gleb M. Akselrod, Durham, NC (US); Mark C. Weidman, Bellevue, WA (US)

(73) Assignee: Elwha LLC, Bellevue, WA (US)

( * ) Notice: Subject to any disclaimer, the term of this patent is extended or adjusted under 35 U.S.C. 154(b) by 0 days.

(21) Appl. No.: 15/824,189

(22) Filed: Nov. 28, 2017

(65) Prior Publication Data

US 2018/0239304 A1 Aug. 23, 2018

Related U.S. Application Data

(60) Provisional application No. 62/462,105, filed on Feb. 22, 2017.

(51) Int. Cl.
*H01L 21/00* (2006.01)
*H01L 27/146* (2006.01)
(Continued)

(52) U.S. Cl.
CPC .. *H01L 27/14625* (2013.01); *B29D 11/00326* (2013.01); *B82Y 20/00* (2013.01);
(Continued)

(58) Field of Classification Search
CPC ..... B82Y 20/00; H01L 27/14625; G02B 5/32; G02B 5/1809; G03H 1/00
See application file for complete search history.

(56) References Cited

U.S. PATENT DOCUMENTS

| 2001/0028483 | A1 | 10/2001 | Buse | |
|---|---|---|---|---|
| 2005/0247866 | A1* | 11/2005 | Plewa | B82Y 10/00 250/251 |

(Continued)

FOREIGN PATENT DOCUMENTS

CN 103259097 A 8/2013

OTHER PUBLICATIONS

Arbabi et al.; "Dielectric metasurfaces for complete control of phase and polarization with subwavelength spatial resolution and high transmission"; Nature Nanotechnology; Aug. 31, 2015; pp. 937-943; vol. 10; Macmillan Publishers Limited.
(Continued)

*Primary Examiner* — Richard A Booth

(57) ABSTRACT

A hologram system may include a hologram chip comprising a wafer substrate having a first plurality of conductive pads on a hologram surface region connected to a second plurality of conductive pads on an interconnect surface region. The hologram chip may also include an array of sub-wavelength hologram elements integrated with a refractive index tunable core material on the hologram region of the wafer substrate. The hologram system may also include a control circuit chip having a third plurality of conductive pads connected to the second plurality of conductive pads on the interconnect region of the wafer substrate. The interconnect region is on the same side of the wafer substrate as the hologram region. The first plurality of conductive pads is directly connected to the array of sub-wavelength hologram elements.

21 Claims, 9 Drawing Sheets

(51) Int. Cl.

| | | |
|---|---|---|
| G02F 1/29 | (2006.01) | |
| G02B 5/18 | (2006.01) | |
| G03H 1/04 | (2006.01) | |
| H04N 5/225 | (2006.01) | |
| H04N 5/374 | (2011.01) | |
| G01S 7/481 | (2006.01) | |
| H01Q 1/38 | (2006.01) | |
| H01Q 3/44 | (2006.01) | |
| H01Q 15/02 | (2006.01) | |
| G01S 17/10 | (2006.01) | |
| G01S 17/42 | (2006.01) | |
| G01S 17/89 | (2006.01) | |
| G02F 1/01 | (2006.01) | |
| G02F 1/1339 | (2006.01) | |
| G02F 1/1341 | (2006.01) | |
| H01J 37/317 | (2006.01) | |
| H01J 37/32 | (2006.01) | |
| B29D 11/00 | (2006.01) | |
| B82Y 20/00 | (2011.01) | |
| G03H 1/00 | (2006.01) | |
| H01Q 15/00 | (2006.01) | |
| H01Q 15/14 | (2006.01) | |
| G02F 1/1334 | (2006.01) | |

(52) U.S. Cl.
CPC .......... *G01S 7/4813* (2013.01); *G01S 7/4817* (2013.01); *G01S 17/10* (2013.01); *G01S 17/42* (2013.01); *G01S 17/89* (2013.01); *G02B 5/1809* (2013.01); *G02F 1/0107* (2013.01); *G02F 1/1339* (2013.01); *G02F 1/1341* (2013.01); *G02F 1/292* (2013.01); *G03H 1/00* (2013.01); *G03H 1/0443* (2013.01); *H01J 37/3174* (2013.01); *H01J 37/32816* (2013.01); *H01L 27/14643* (2013.01); *H01Q 1/38* (2013.01); *H01Q 3/44* (2013.01); *H01Q 15/02* (2013.01); *H04N 5/2253* (2013.01); *H04N 5/374* (2013.01); *G02F 1/13342* (2013.01); *G02F 2202/103* (2013.01); *G02F 2202/30* (2013.01); *G02F 2202/36* (2013.01); *H01J 2237/334* (2013.01); *H01Q 15/002* (2013.01); *H01Q 15/0066* (2013.01); *H01Q 15/148* (2013.01)

(56) References Cited

U.S. PATENT DOCUMENTS

| | | |
|---|---|---|
| 2008/0128774 A1 | 6/2008 | Irani et al. |
| 2009/0169866 A1* | 7/2009 | Ostafin .................. B82Y 20/00 428/323 |
| 2010/0075262 A1 | 3/2010 | Koefer et al. |
| 2010/0276665 A1 | 11/2010 | Wang |
| 2012/0194399 A1 | 8/2012 | Bily et al. |
| 2014/0266946 A1 | 9/2014 | Bily et al. |
| 2015/0162658 A1 | 6/2015 | Bowers et al. |
| 2015/0318618 A1 | 11/2015 | Chen et al. |
| 2015/0318620 A1 | 11/2015 | Black et al. |
| 2015/0372389 A1 | 12/2015 | Chen et al. |
| 2015/0380828 A1 | 12/2015 | Black et al. |
| 2016/0303879 A1 | 10/2016 | Yamada et al. |
| 2016/0320531 A1 | 11/2016 | Kamali et al. |
| 2016/0370568 A1 | 12/2016 | Toussaint et al. |
| 2017/0047312 A1 | 2/2017 | Budd et al. |
| 2017/0171540 A1 | 6/2017 | Li et al. |
| 2017/0212285 A1 | 7/2017 | Arbabi et al. |
| 2018/0239213 A1* | 8/2018 | Akselrod ......... B29D 11/00326 |

OTHER PUBLICATIONS

PCT International Search Report; International App. No. PCT/US2018/019036; dated Jun. 11, 2018; pp. 1-3.
Y. Huang et al., "Gate-tunable conducting oxide metasurfaces," Nano Lett. 16, 5319 (2016).
A. Pors, S. I. Bozhevolnyi, "Plasmonic metasurfaces for efficient phase control in reflection," Opt. Express 21, 27438 (2013).
A. Arbabi, Y. Horie, A. J. Ball, M. Bagheri, A. Faraon, "Subwavelength-thick lenses with high numerical apertures and large efficiency based on high contrast transmitarrays," Nat. Commun. 6, 1 (2014).
C. Haffner et al., "All-plasmonic Mach-Zehnder modulator enabling optical high-speed communication at the microsale."Nat. Photonics 9, 525-528 (2015).
M. Li et al., "Poling efficiency enhancement of tethered binary nonlinear optical chromophores for achieving an ultrahigh n3r33 figure-of-merit of 2601 pm V?1" J. Mater. Chem. C 3, 6737-6744 (2015).
X. Zhang et al., "High performance optical modulator based on electro-optic polymer filled silicon slot photonic crystal waveguide," J. Light. Technol. 34, 2941-2951 (2016).
Y. Xing et al., "Digitally controlled phase shifter using an SOI slot waveguide with liquid crystal infiltration," 27, 1269-1272 (2015).
V. Borshch, S. V. Shiyanovskii, O. D. Lavrentovich, "Nanosecond electro-optic switching of a liquid crystal," Phys. Rev. Lett. 111,107802 (2013).
H. Chen et al., "Ultra-low viscosity liquid crystal materials," Opt. Mater. Express 5, 655 (2015).
B. Gholipour, J. Zhang, K. F. MacDonald, D. W. Hewak, N. I. Zheludev, "An all-optical, non-volatile, bidirectional, phase-change meta-switch," Adv. Mater. 25, 3050 (2013).
S. Raoux, F. Xiong, M. Wuttig, E. Pop, "Phase change materials and phase change memory," MRS Bull. 39, 703 (2014).
C. Rios, et al., "Integrated all-photonic non-volatile multi-level memory," Nat. Photonics 9, 725 (2015).
PCT International Search Report; International App. No. PCT/US2018/019269; dated Jun. 4, 2018; pp. 1-4.
Arbabi et al.; "Dielectric metasurfaces for complete control of phase and polarization with subwavelength spatial resolution and high transmission"; Nature Nanotechnology 2015; pp. 1-9; Macmillan Publishers Limited.

* cited by examiner

CONTROL CIRCUITRY FOR 1D OPTICAL METASURFACES

If an Application Data Sheet ("ADS") has been filed on the filing date of this application, it is incorporated by reference herein. Any applications claimed on the ADS for priority under 35 U.S.C. §§ 119, 120, 121, or 365(c), and any and all parent, grandparent, great-grandparent, etc. applications of such applications, are also incorporated by reference, including any priority claims made in those applications and any material incorporated by reference, to the extent such subject matter is not inconsistent herewith.

If the listings of applications provided above are inconsistent with the listings provided via an ADS, it is the intent of the Applicant(s) to claim priority to each application that appears in the Domestic Benefit/National Stage Information section of the ADS and to each application that appears in the Priority Applications section of this application.

All subject matter of the Priority Applications and of any and all applications related to the Priority Applications by priority claims (directly or indirectly), including any priority claims made and subject matter incorporated by reference therein as of the filing date of the instant application, is incorporated herein by reference to the extent such subject matter is not inconsistent herewith.

CROSS-REFERENCE TO RELATED PATENT APPLICATION

The present application claims the benefit of the earliest available effective filing date(s) from the following listed application(s) (the "Priority Applications"), if any, listed below (e.g., claims earliest available priority dates for other than provisional patent applications, or claims benefits under 35 U.S.C. § 119(e) for provisional patent applications, for any and all parent, grandparent, great-grandparent, etc. applications of the Priority Application(s)).

PRIORITY APPLICATIONS

The present application claims benefit of priority of U.S. Provisional Patent Application No. 62/462,105, entitled "Optical Surface Scattering Antennas," filed on Feb. 22, 2017, which was filed within the twelve months preceding the filing date of the present application or is an application of which a currently co-pending priority application is entitled to the benefit of the filing date.

RELATED APPLICATIONS

This patent application relates to U.S. patent application Ser. No. 15/799,654, entitled "Fabrication of Optical Metasurfaces," filed on Oct. 31, 2017, which is incorporated herein by reference in its entirety.

FIELD

The disclosure is directed to control circuitry for one dimensional metasurface arrays. In particular, the disclosure is directed to a hologram system including one or more hologram chip(s) and one or more control circuit chip(s). The disclosure also includes methods for forming the hologram chip(s) and methods for assembling the hologram chip(s) and the control circuit chip(s).

BACKGROUND

Autonomous systems, such as vehicles, drones, robotics, security, mapping, among others, need to view the world in 3D. Scanning Light Detection and Ranging (Lidar) is the 3D sensor for self-driving cars. The current Lidar is unreliable, bulky and high cost. Lidar can also be used to make nigh-resolution maps and provides dynamic field of view.

Solid state Lidar uses chips and does not include moving parts and thus has high reliability. The solid state Lidar also uses low power, and small packages, and is able to use low cost CMOS fabrication technique. The solid state Lidar can have mass production. However, there still remains a need to develop techniques to produce solid-state Lidar.

BRIEF SUMMARY

In an embodiment, a hologram system may include a hologram chip comprising a wafer substrate having a first plurality of conductive pads on a hologram surface region connected to a second plurality of conductive pads on an interconnect surface region. The hologram chip may also include an array of sub-wavelength hologram elements integrated with a refractive index tunable core material on the hologram region of the wafer substrate. The hologram system may also include a control circuit chip having a third plurality of conductive pads connected to the second plurality of conductive pads on the interconnect region of the wafer substrate. The interconnect region is on the same side of the wafer substrate as the hologram region. The first plurality of conductive pads is directly connected to the array of sub-wavelength hologram elements.

In an embodiment, a hologram system may include one or more hologram chips, each of the one or more hologram chips comprising an array of sub-wavelength hologram elements integrated with a refractive index tunable core material on a wafer substrate and a plurality of through-vias in the respective wafer substrates. The hologram system may also include an interposer positioned under the one or more hologram chips and electrically coupled to the one or more hologram chips. The hologram system may further include a control circuit chip disposed on the top of the interposer. The control circuit chip is electrically connected to the one or more arrays of sub-wavelength hologram elements through the respective plurality of through-vias in each of the one or more respective wafer substrates for the one or more hologram chips. Each of the one or more respective wafer substrates are positioned between the interposer and the one or more arrays of sub-wavelength holograph elements.

In an embodiment, a method is provided for fabricating a hologram chip suitable for bonding to a control circuit chip. The method may include fabricating a first plurality of conductive pads in a hologram region of a wafer substrate. The method may also include forming a second plurality of conductive pads in an interconnect region of the wafer substrate. The method may further include fabricating an interconnecting wire bus on the wafer substrate to connect the first plurality of conductive pads to the second plurality of conductive pads. The method may also include forming an array of sub-wavelength hologram elements over the wafer substrate in the hologram region such that the array of sub-wavelength hologram elements is respectively directly coupled to the first plurality of conductive pads. The sub-wavelength hologram elements are integrated with a refractive index tunable core material.

In an embodiment, a method is provided for assembling a hologram chip and a control circuit chip. The method may include providing a hologram chip having a wafer substrate having a first plurality of conductive pads in a hologram region and a second plurality of conductive pads in an interconnect region and an array of sub-wavelength hologram elements in the hologram region on the wafer substrate. The first plurality of conductive pads is electrically connected to the hologram elements. The method may also include flipping a control circuit chip having a third plurality of conductive pads such that the third plurality of conductive pads face down. The method may further include bonding the second plurality of conductive pads in the interconnect region to the third plurality of conductive pads such that the control circuit chip is electrically connected to the hologram chip.

In an embodiment, a method is provided for fabricating a hologram chip suitable for bonding to a control circuit chip. The method may include fabricating an array of sub-wavelength hologram elements on a first side of a wafer substrate. The method may also include forming through-silicon vias on the wafer substrate. The method may further include forming a first plurality of conductive pads on a second side of the wafer substrate. The sub-wavelength hologram elements are respectively coupled to the first plurality of conductive pads via the through-silicon vias. The sub-wavelength hologram elements are integrated with a refractive index tunable core material.

In an embodiment, a method is provided for fabricating a hologram system. The method may include (a) fabricating an array of sub-wavelength hologram elements on a first side of a wafer substrate. The method may also include (b) forming through-silicon vias on the wafer substrate. The method may further include (c) fabricating a first plurality of conductive pads on a second opposite side of the wafer substrate to form a first hologram chip and (d) bonding a second plurality of conductive pads on a first region of the control circuit chip to the first plurality of conductive pads of the first hologram chip such that the control circuit chip connects to the hologram elements of the first hologram chip. The sub-wavelength hologram elements are integrated with a refractive index tunable core material.

Additional embodiments and features are set forth, in part, in the description that follows, and will become apparent to those skilled in the art upon examination of the specification or may be learned by the practice of the disclosed subject matter. A further understanding of the nature and advantages of the present disclosure may be realized by reference to the remaining portions of the specification and the drawings, which form a part of this disclosure.

BRIEF DESCRIPTION OF THE DRAWINGS

The description will be more fully understood with references to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

Overview

The disclosure provides a hologram chip including a 1D array of hologram elements. Each hologram elements includes a pair of dielectric pillars or nano walls. The disclosure also provides methods for connecting the hologram chip to a control circuit chip by using flip-chip bonding. In one embodiment, the control circuit chip is bonded to the hologram chip on the same side as the hologram chip. In another embodiment, the control circuitry chip is bonded to the hologram chip on the opposite side from the hologram chip, using through-silicon vias (TSVs) to route the wire bus to the opposite side. In a further embodiment, for a large hologram chip, the array may be divided onto sub-arrays. Each sub-array is on a separate chip which is smaller than a single large chip. Then, by using flip-chip bonding, the control circuitry chip(s) are bonded to the sub-array chips onto a common carrier or an interposer.

Figure 1A:
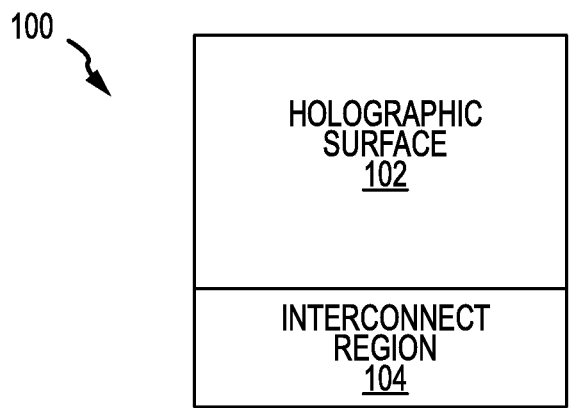
FIG. 1A shows a top overview of a holographic metasurface device in accordance with embodiments of the disclosure.

FIG. 1A shows a top overview of a holographic metasurface device in accordance with embodiments of the disclosure. As shown in FIG. 1A, a holographic metasurface device 100 has a holographic metasurface region 102, including an array of holographic elements on a first portion of a wafer 114, which can be seen in FIG. 1B. The holographic metasurface region 102 includes an array of hologram elements. Each holographic element includes a pair of dielectric pillars and a refractive index tunable core between the pair of dielectric pillars. The dielectric pillars may be formed of amorphous silicon (a-Si) or crystalline silicon. It will be appreciated that in some approaches, adjacent pairs of holographic elements may share a common dielectric pillar; e.g., a dielectric pillar may simultaneously serve as the right member of a first pair of dielectric pillars and as the left member of a second pair of dielectric pairs.

The holographic metasurface device 100 may also have an interconnect region 104 including circuitry such as CMOS transistors on a second portion of the wafer. The circuitry such as CMOS transistors in the interconnect region 104 can control the voltage applied to the dielectric pillars of each of the holographic elements. The CMOS transistors have low static power consumption and high noise immunity. The array of holographic elements and the electrical control circuit are decoupled.

Figure 1B:
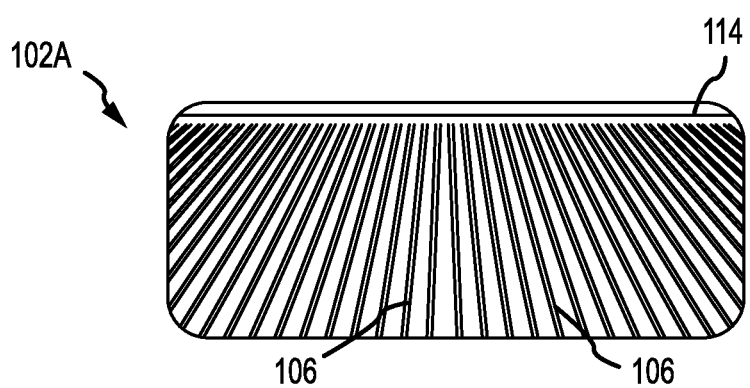
FIG. 1B is a perspective view of a 1D holographic metasurface device in accordance with embodiments of the disclosure.

FIG. 1B is a perspective view of 1D holographic metasurface device in accordance with embodiments of the disclosure. As shown in FIG. 1B, an array 102A includes a plurality of columns of holographic elements 106 arranged linearly on a wafer.

Figure 2A:
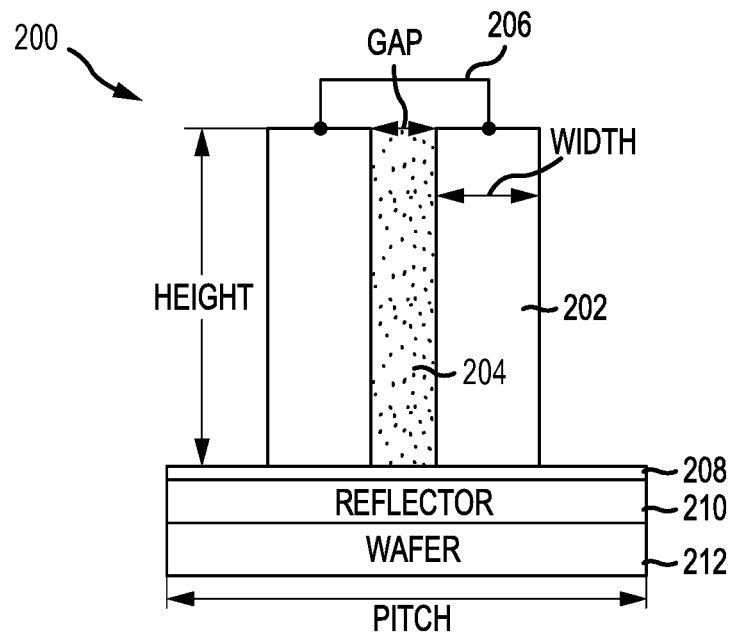
FIG. 2A shows a side view of one sub-wavelength holographic element including a pair of a-Si pillars in the array of FIG. 1B in accordance with embodiments of the disclosure.

FIG. 2A shows a side view of one of the sub-wavelength holographic element including a pair of a-Si pillars in the array of FIG. 1B in accordance with embodiments of the disclosure. As depicted, a holographic element 200, e.g. a sub-wavelength metasurface holographic element, includes a refractive index tunable material 204 between two dielectric pillars 202, such as a-Si pillars over a wafer 212. The wafer 212 may be a crystalline silicon wafer, among others. A control voltage 206 is applied across the two dielectric pillars 202. The electric and magnetic energy densities are across the holographic element 200. The dielectric pillars 202 are placed over an oxide layer 208, such as Al$_2$O$_3$, which is an etch stop layer.

A metallic reflector 210 is placed between the wafer 212 and the oxide layer 206. In some embodiments, the metal reflector 210 under the dielectric pillars 202, such as amorphous silicon (a-Si) pillars, may be made from copper, aluminum, or other CMOS-compatible metal, without sacrificing performance.

Figure 2B:
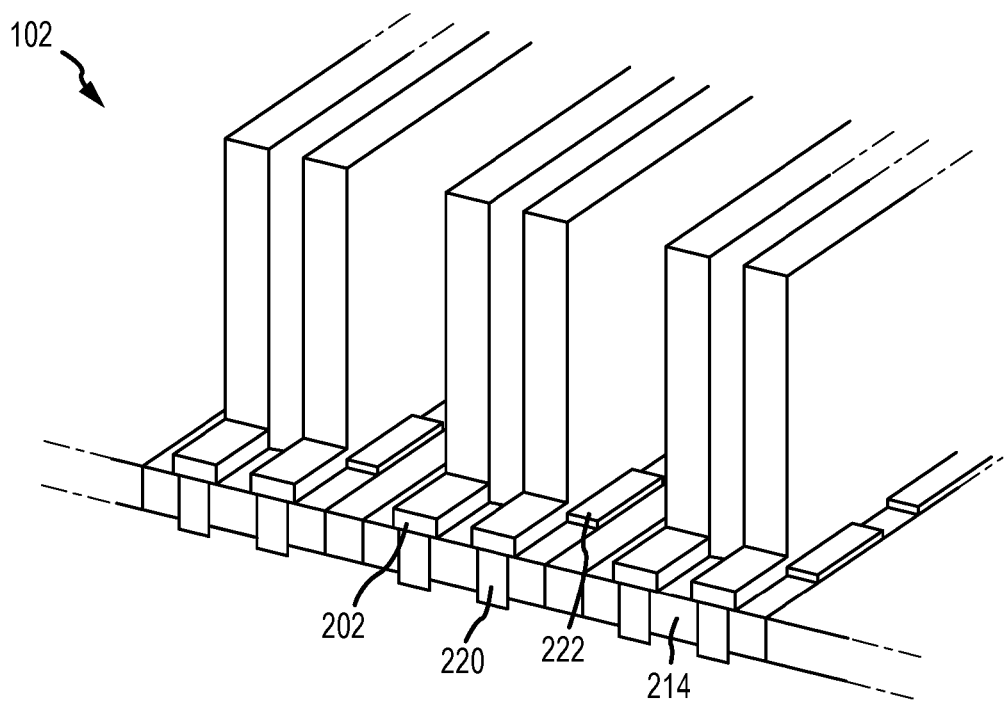
FIG. 2B shows a schematic of the 1D holographic metasurface including metal vias in accordance with embodiments of the disclosure.

FIG. 2B shows a schematic of the 1D holographic metasurface including metal vias in accordance with embodiments of the disclosure. As shown in FIG. 2B, the hologram metasurface 102 includes a 1D array of hologram elements 214, which includes a pair of dielectric pillars 202 and a tunable core material 204 between the pillars 202. Each dielectric pillar 202 extends sideway and has an extension 202 makes contact with a metal via 220, such as through-silicon via (TSV).

Figure 3:
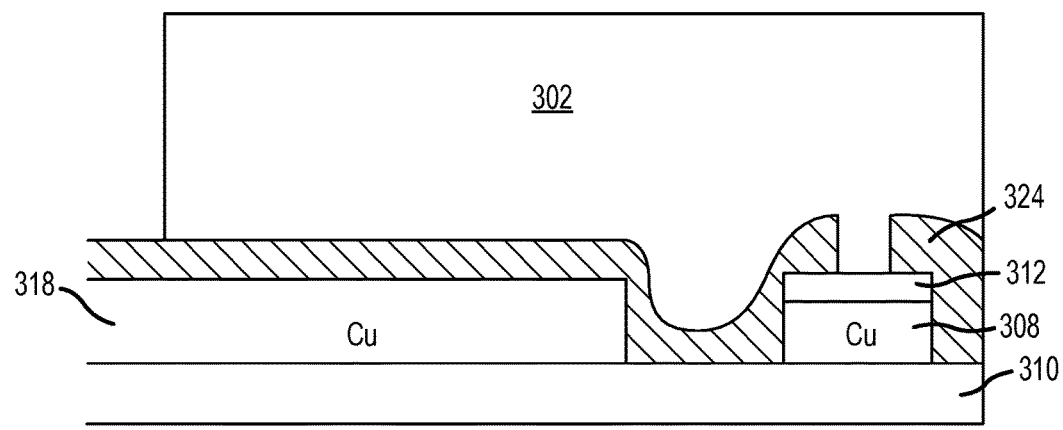
FIG. 3 shows a cross-sectional view of a bus connection to a-Si pillars in accordance with embodiments of the disclosure.

FIG. 3 shows a cross-sectional view of a bus connection to a-Si pillars in accordance with embodiments of the disclosure. As shown in FIG. 3, a reflector layer 318 and a bus connection 308 are disposed over a wafer substrate 310. A dielectric pillar 302, such as a-Si pillar, directly contacts the bus connection 308 through a titanium (Ti) adhesion layer 312. The a-Si pillar 302 is disposed over an oxide layer 324, which is disposed over the reflector layer 318. The reflector layer 318 may be formed of a metal, such as Cu, among others. The oxide 324 may be formed of Al$_2$O$_3$. The bus connection 308 may also be formed of a metal, such as Cu among others.

Hologram Systems Including Control Circuit Chip

Figure 4A:
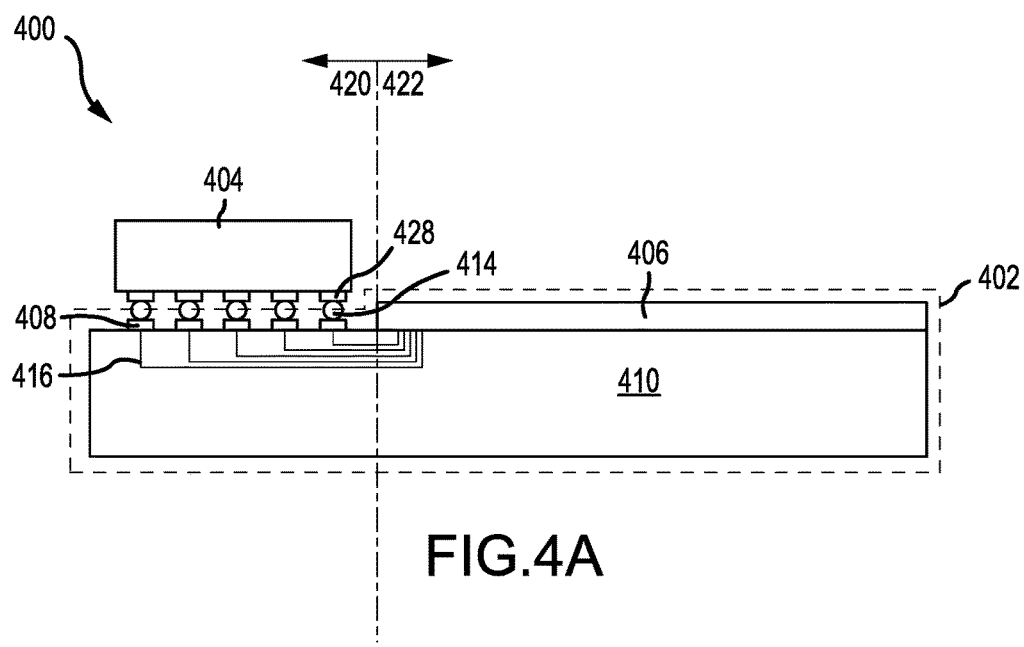
FIG. 4A is a side view of a hologram system including a hologram chip and a control circuit chip (e.g. CMOS chip) on the same side of the hologram chip in accordance with embodiments of the disclosure.
Figure 4B:
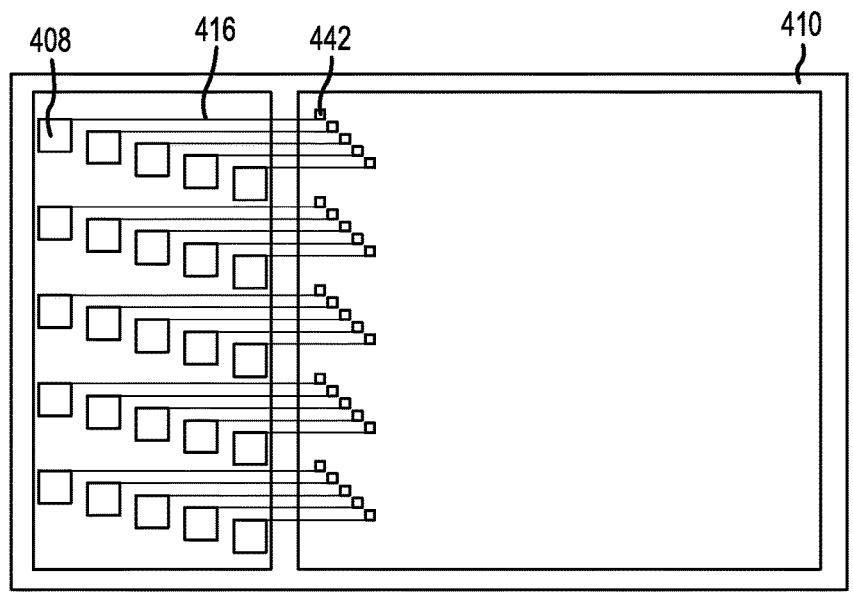
FIG. 4B is a top view of the hologram system of FIG. 4A.

FIG. 4A is a side view of a hologram system including a hologram chip and a control circuit chip (e.g. CMOS chip) on the same side of the hologram chip in accordance with embodiments of the disclosure. FIG. 4B is a top view of the hologram system of FIG. 4A. As shown, a hologram system 400 includes a hologram chip 402 that connects to a control circuit chip 404 having a plurality of conductive pads 428.

The hologram chip 402 includes a wafer substrate 410 and an array of hologram elements 406 on the top side of the wafer substrate 410. The wafer substrate 410 includes a first plurality of conductive pads 442 in a hologram region 422, which is on the right side of the wafer as pointed by arrow toward the right. The first plurality of conductive pads 412 are directly connected to the hologram elements 406.

The wafer substrate 410 also includes a second plurality of conductive pads 408 in an interconnect region 420 which is on the left side of the wafer substrate 410, as pointed by arrow toward the left. The conductive pads 408 on the top-surface of the interconnect region can directly bond to the plurality of conductive pads 428 of the control circuit chip 404 through solder bumps 414. The wafer substrate also includes an interconnection wire bus 416 having a plurality of wires that connect the first plurality of conductive pads 412 to the second plurality of conductive pads 408.

To attach the hologram chip 402 to the control circuit chip, the solder bumps may be deposited on the conductive pads on the top side of the control circuit chip. Then, the control circuit chip 404 can be inverted or flipped to bring the solder bumps down onto the conductive pads 408 on the wafer substrate 410. As such, the control circuit chip 404 connects to the hologram chip 402.

The hologram system 400 is small. The hologram chip and the CMOS chip sit directly on the wafer. The short wires greatly reduce inductance, allowing higher-speed signals, and also conduct heat better.

Figure 5A:
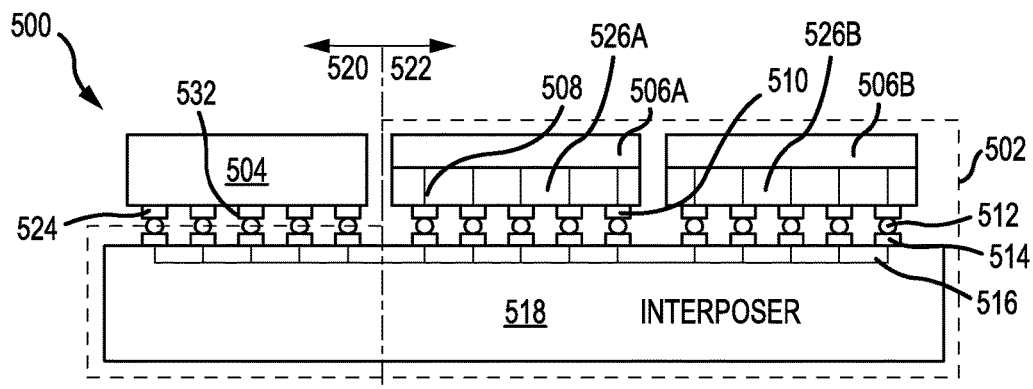
FIG. 5A is a side view of a hologram system including two or more hologram chips and two or more control circuit chips on the same side of the hologram chips in accordance with embodiments of the disclosure.
Figure 5B:
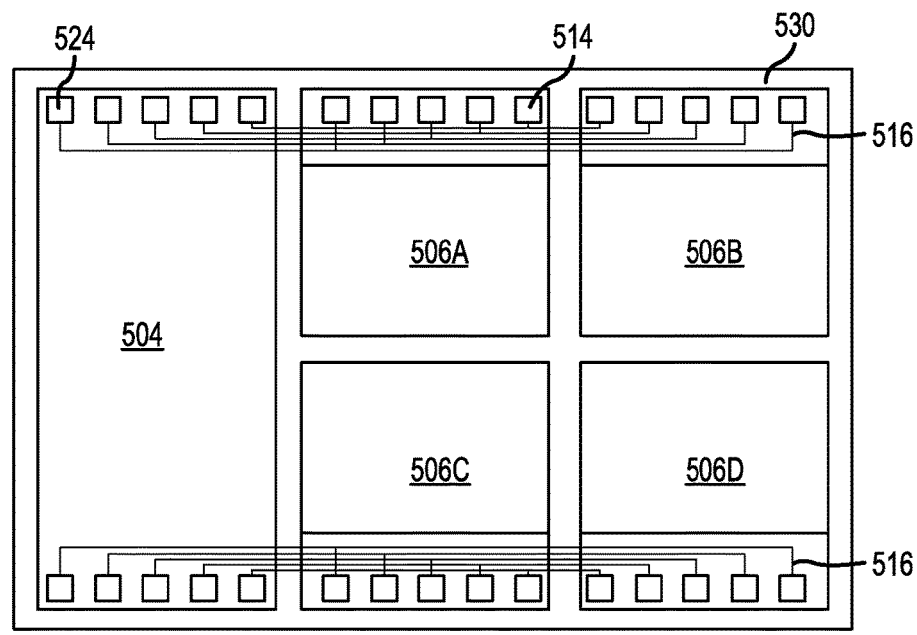
FIG. 5B is a top view of the hologram system of FIG. 5A.

FIG. 5A is a side view of a hologram system including two or more hologram chips and two or more control circuit chips on the same side of the hologram chips in accordance with embodiments of the disclosure. FIG. 5B is a top view of the hologram system of FIG. 5A. As shown, a hologram system 500 includes a hologram chip 502 and connects to a control circuit chip 504. The control circuit chip 504 may include control logic circuit, memory, input and output (I/O).

The hologram chip 502 includes two or more arrays of hologram elements, e.g. 506A and 506B, on small wafer substrates 526A and 526B. The hologram chip 502 may also include an interposer 518 which connects to the small wafer substrates 526A-B and also connects to the control circuit chip 504. By using multiple small wafer substrates, the hologram chip 502 may have a lower failure rate and a higher production yield than a large hologram chip. The manufacturing of small chips may also be simpler than for a large chip.

The interposer 518 is an electrical interface routing between the small hologram chips including wafer substrates 526A-B and arrays of hologram elements 506A-B and the control circuit chip 504. The interposer 518 can spread a connection to a wider pitch. The interposer 518 can also reroute a connection to a different connection.

The interposer 518 may have very flat surfaces for the control circuit chip 504 to mount. The flatness may be difficult to maintain as the interposer may change its temperature, due to environment, or electric currents. Also, the short connections may be very stiff and thus the thermal expansion of the control circuit chip may need to match to the interposer.

The interposer 518 includes a plurality of conductive pads 516 on its top side in a hologram region 522, on the right side of the interposer, as pointed by arrow toward the right. The interposer 518 also includes a plurality of conductive pads 524 in an interconnect region 520, on the left side of the interposer, as pointed by an arrow toward the left. The conductive pads 524 on the top-surface of the interconnect region can directly bond to the plurality of conductive pads 524 of the control circuit chip 504 through solder bumps 512. The interposer 518 also includes an interconnection wire bus 516 having a plurality of wires that connect the first plurality of conductive pads 514 to the second plurality of conductive pads 524.

As shown in FIG. 5A, each wafer substrate 526A or 526B includes a plurality of through-silicon vias (TSVs), which are vertical interconnections that pass through each silicon wafer substrate 526A or 526B. The TSV(s) are used as an alternative to wire-bond and flip chips to create 3D packages and 3D integrated circuits. The density of the TSVs is substantially high, and the length of the connections are short.

By using TSVs, it is possible to achieve connections between the hologram chip including hologram elements on the top side of the wafers and the interposer 518. The TSVs may induce thermo-mechanical stress in the wafer, which may affect the performance of the system.

The TSVs are formed in the wafer substrates and can connect to a plurality of conductive pads 510 formed on the bottom side of the wafer 526A or 526B. The TSVs form interconnects between the hologram elements and the conductive pads 510, eliminate wire bonds, and allows for reduced form factor and higher-density interconnects. The conductive pads 510 of the small hologram chips may bond to conductive pads 514 on the interposer 518 via solder bumps 512. As such, the control circuit chip 504 connects to the hologram chip 502.

Turning to FIG. 5A again, the control circuit chip 504 is on the same side as the small hologram chips. This can be accomplished by flipping the control circuit chip 504, and bonding the control circuit chip 504 onto the top of the interposer 518 in the interconnect region 520.

An underfill material 532 may fill the space between the interposer 518 and the control circuit chip 504. The underfill material may act as an intermediate between the difference in coefficient of thermal expansion (CTE) of the control circuit chip and the interposer. In some embodiments, an electrically-insulating adhesive may be used to fill the space, also referred to underfill material, and thus provides a stronger mechanical connection and ensures the solder joints are not stressed due to differential heating of the CMOS chip and the remaining system. The underfill material distributes the thermal expansion mismatch between the chip and the interposer, and may reduce stress concentration in the solder joints, and thus may lead to a reduced failure.

Figure 6:
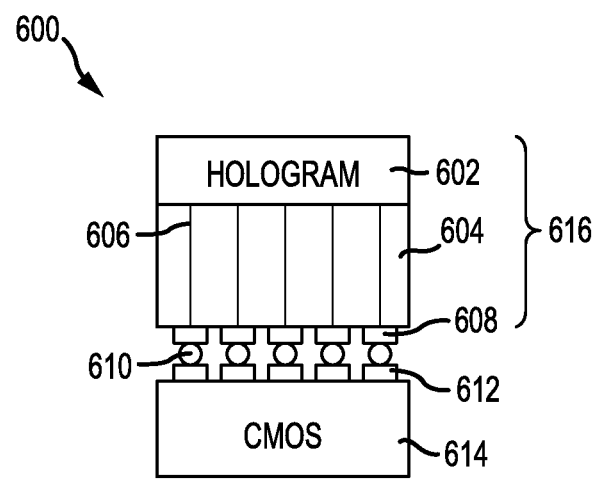
FIG. 6 shows a side view of a hologram system including a hologram chip and a control circuit chip on an opposite side of the hologram elements in accordance with embodiments of the disclosure.

FIG. 6 shows a side view of a hologram system including a hologram chip and a control circuit chip on an opposite side of the hologram elements in accordance with embodiments of the disclosure. As shown, a hologram system 600 includes a hologram chip 616 having a hologram metasurface 602 on the top of a wafer substrate 604. The hologram metasurface 602 includes an array of hologram elements that are connected to conductive pads 608 through TSVs 606 formed in the wafer substrate 604.

The hologram system 600 also includes a CMOS chip 614 on the bottom of the wafer substrate 604. The CMOS chip connects to the hologram chip 616 via bonding conductive pads 608 on the bottom of the wafer substrate 604 to conductive pads 612 on the top of the CMOS chip via solder bumps 610.

Figure 7:
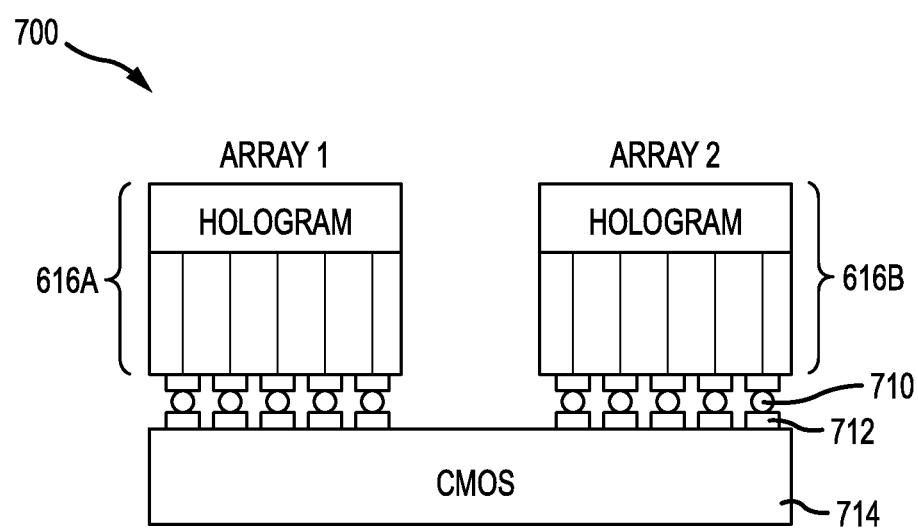
FIG. 7 shows a side view of a hologram system including two or more hologram chips and two or more control circuit chips on an opposite side of the hologram elements in accordance with embodiments of the disclosure.

FIG. 7 shows a side view of a hologram system including two or more hologram chips and two or more control circuit chips on an opposite side of the hologram elements in accordance with embodiments of the disclosure. As shown, a hologram system 700 includes at least two hologram chips 616A-B connected to a common control circuit chip 714, such as a CMOS chip. Each of the hologram chips 616A-B connects to the CMOS 714 by bonding to conductive pads 712 via solder bumps 710.

Fabrication Processes

Figure 8:
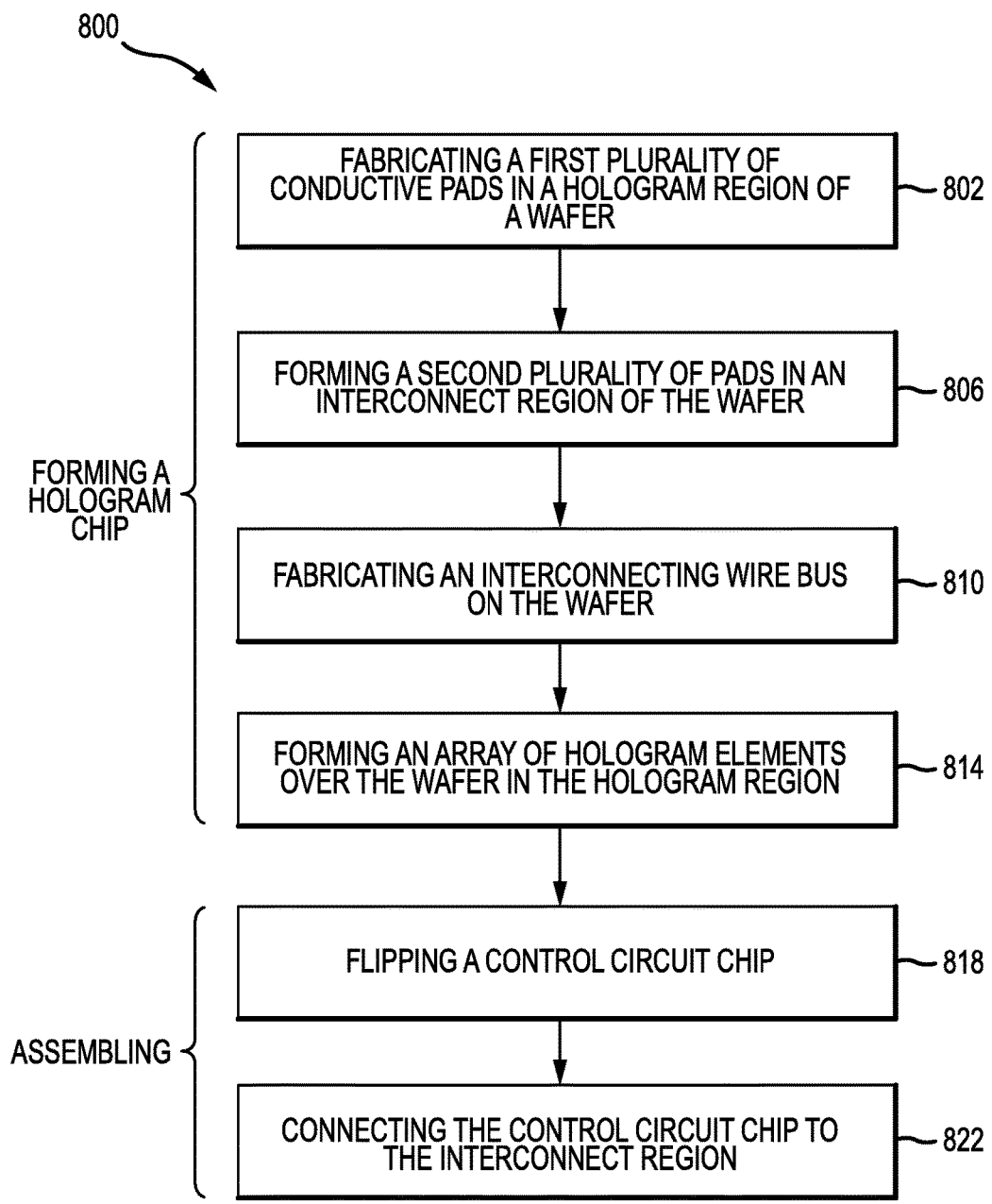
FIG. 8 is a flow chart illustrating steps for fabricating a hologram system with a control circuit chip and a hologram chip on the same side of a wafer in accordance with embodiments of the disclosure.

FIG. 8 is a flow chart illustrating steps for fabricating a hologram system with a control circuit chip and a hologram chip on the same side of a wafer in accordance with embodiments of the disclosure. As shown, a method 800 may include fabricating a hologram chip and assembling the hologram chip with a control circuit chip, such as a CMOS chip.

The method 800 starts with fabricating a first plurality of conductive pads in a hologram region of a wafer at operation 802, followed by forming a second plurality of conductive pads in an interconnect region of the wafer at operation 806. The method 800 also includes fabricating an interconnecting wire bus on the wafer substrate to connect the first plurality of conductive pads to the second plurality of conductive pads at operation 810.

The method 800 may also include forming an array of sub-wavelength hologram elements over the wafer substrate in the hologram region at operation 814, such that the array of sub-wavelength hologram elements is respectively directly coupled to the first plurality of conductive pads. The sub-wavelength hologram elements are integrated with a refractive index tunable core material.

The assembling of the hologram chip with the control circuit chip may include flipping a control circuit chip having a third plurality of conductive pads at operation 818, such that the third plurality of conductive pads faces down. Flip chip bonding is a method for interconnecting the hologram chip to the control circuit chip, such as CMOS chip(s), via solder bumps. The solder bumps may be deposited on the conductive pads on the top side of the control circuit chip. When the control circuit chip is on the same side as the hologram chip, the control circuit chip can be flipped over, so that its top side faces down to mount on the wafer in the interconnection region.

The method 800 may further include connecting the control circuit chip to the interconnection region. The second plurality of conductive pads in the interconnect region is bonded to the third plurality of conductive pads via solder bumps. The control circuit chip may be positioned such that its conductive pads align with respective conductive pads in the interconnect region of the wafer.

The solder bumps may be heated to be above the melting point of the solder to produce an electrical connection, for example, using a Thermosonic bonding or a reflow solder process. Reflowing the solder balls includes heating the solder bumps to a temperature above the melting temperature of the solder bumps, such that the solder bumps melt and bond the conductive pads. This also leaves a small underlying space between the control circuit chip and the wafer or an underlying mounting. The underlying space may be filled with the underfill material as discussed earlier.

The solder bumps provide the contact between the hologram chip and the wafer and also between the control circuit chip and the interposer. The solder bumps are small spheres of solder that are bonded to the contact areas or conductive pads of the control circuit chip. The solder bumps can be used for face-down bonding. The solder bumps can be held in place with a tacky flux.

In some embodiments, the solder bumps may include gold stud bumps, conductive epoxy, copper balls, or lead-free solders. The solder balls may be selected to absorb the stresses related to GTE mismatch, drop shock, and temperature cycle test.

The length of the electrical connections between the control circuit chip and wafer or interposer can be controlled by placing solder bumps on the control circuit chip (e.g. CMOS chip), then flipping the CMOS chip over, aligning the solder bumps with the conductive pads on the wafer substrate or the interposer, and re-flowing the solder balls or solder bumps in a furnace to establish the bonding between the conductive pads of the CMOS chip and the wafer substrate or the interposer.

Figure 9:
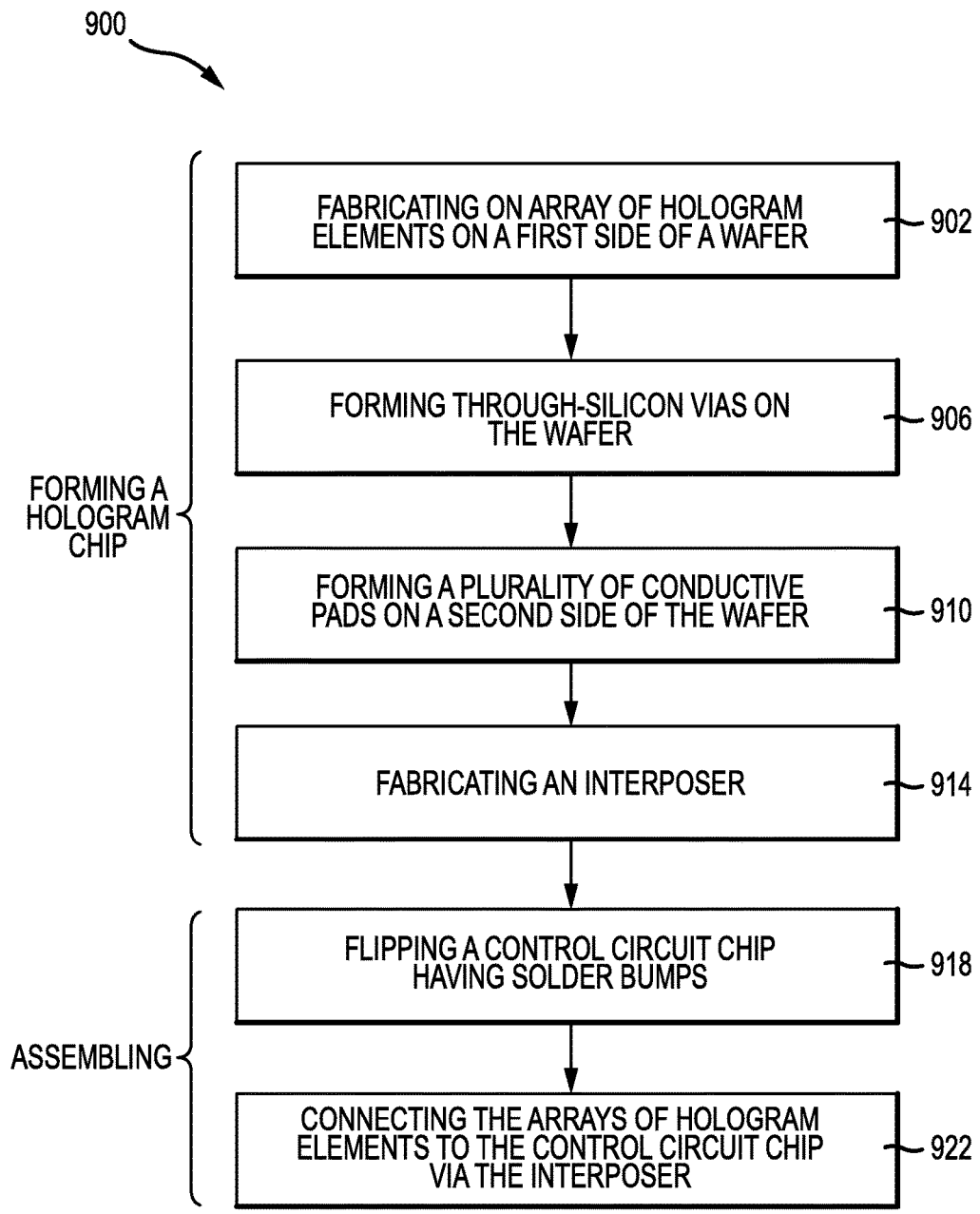
FIG. 9 is a flow chart illustrating steps for fabricating a hologram system with a control circuit chip and two or more hologram chips on the same side of an interposer in accordance with embodiments of the disclosure.

FIG. 9 is a flow chart illustrating steps for fabricating a hologram system with a control circuit chip and two or more hologram chips on the same side of an interposer in accordance with embodiments of the disclosure. A method 900 includes fabricating an array of sub-wavelength hologram elements on a first side of a wafer substrate at operation 902. The method 900 also includes forming through-silicon vias on the wafer substrate at operation 906. The method 900 further includes forming a first plurality of conductive pads on a second side of the wafer substrate at operation 910. The sub-wavelength hologram elements are respectively coupled to the first plurality of conductive pads via the through-silicon vias. The sub-wavelength hologram elements are also integrated with a refractive index tunable core material.

The method 900 also includes fabricating an interposer at operation 914. The interposer includes a second plurality of conductive pads in a hologram region and a third plurality of conductive pads in an interconnect region. The second plurality of conductive pads is electrically connected to the third plurality of conductive pads via an interconnecting wire bus.

It will be appreciated by those skilled in the art that the sequence of the steps 902, 906, 910, and 914 may vary. In an alternative embodiment, the method may include operations or steps 910, 906, 902, and then 914. In other embodiments, the method may include steps or operations 902, 906, 910, and 914 in any order.

The method 900 further includes flipping a control circuit chip having a fourth plurality of conductive pads such that the fourth plurality of conductive pads face down toward the third plurality of conductive pads at operation 918.

The method 900 further includes connecting the array of hologram elements to a control circuit chip via the interposer at operation 922. The connecting includes bonding the first plurality of conductive pads of each of the one or more hologram chips to the second plurality of conductive pads in the hologram region of the interposer via solder bumps, such that the one or more hologram chips connect to the interposer. The connecting also includes bonding a fourth plurality of conductive pads of the control circuit chip to the third plurality of conductive pads in the interconnect region of the interposer via solder bumps, such that the control circuit chip connects to the interposer. The connecting further includes bonding the fourth plurality of conductive pads to the third plurality of conductive pads to electrically couple the arrays of sub-wavelength hologram elements of the one or more hologram chips to the control circuit chip.

Figure 10:
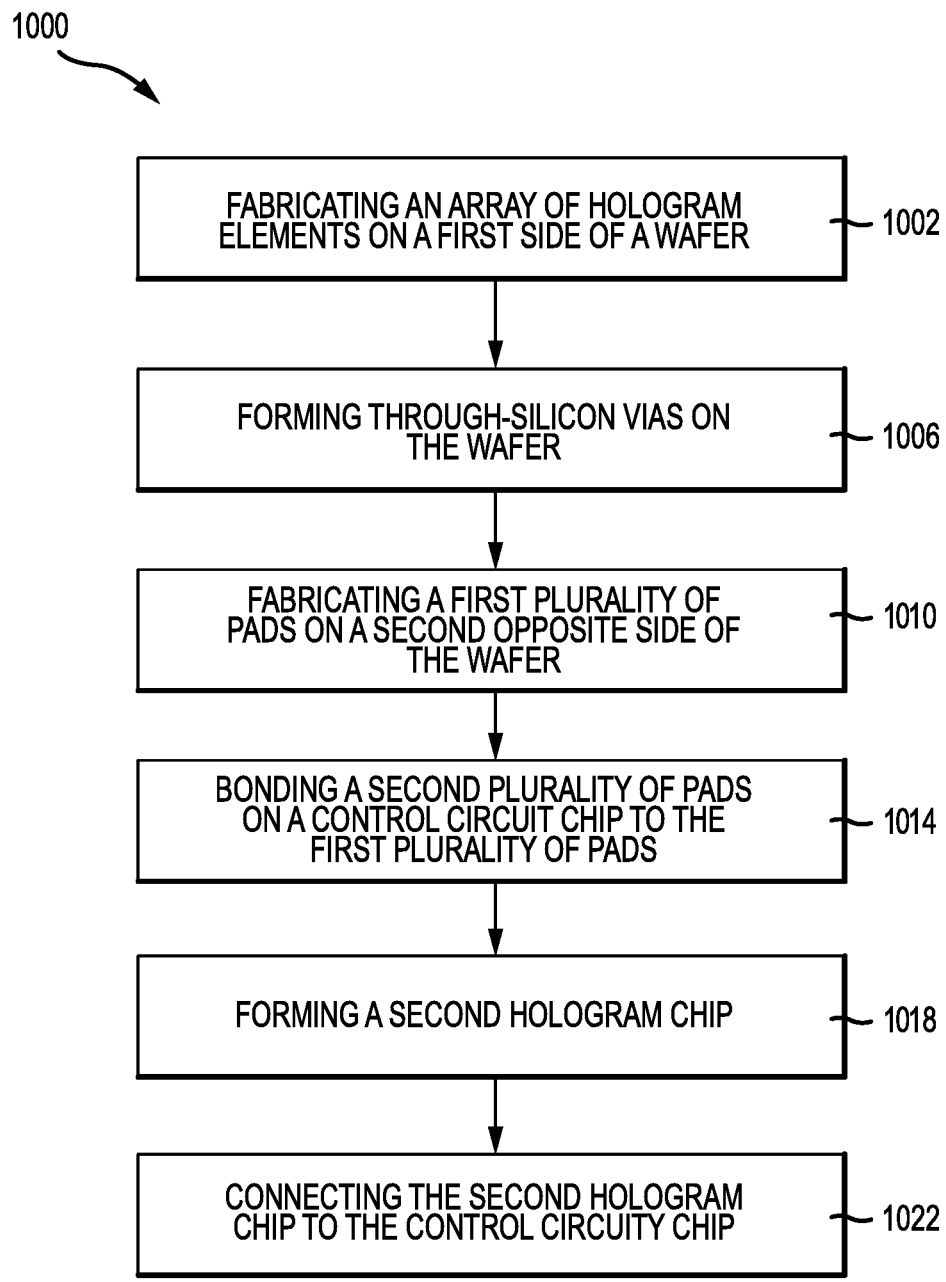
FIG. 10 is a flow chart illustrating steps for fabricating a hologram system with a control circuit chip and a hologram chip on opposite sides of a wafer in accordance with embodiments of the disclosure.

FIG. 10 is a flow chart illustrating steps for fabricating a hologram system with a control circuit chip and a hologram chip on opposite sides of a wafer in accordance with embodiments of the disclosure. A method 1000 includes fabricating an array of sub-wavelength hologram elements on a first side of a wafer substrate at operation 1002, followed by forming through-silicon vias on the wafer substrate at operation 1006. The method 1000 continues with fabricating a first plurality of conductive pads on a second opposite side of the wafer substrate to form a first hologram chip at operation 1010.

It will be appreciated by those skilled in the art that the sequence of the steps 1002, 1006, and 1010 may vary. In an alternative embodiment, the method may include operations 1010, 1006, and then 1002. In other embodiments, the method may include operations 1002, 1006, and 1010 in any order.

The method 1000 further includes bonding a second plurality of conductive pads on a first region of the control circuit chip to the first plurality of conductive pads of the first hologram chip at operation 1014, such that the control circuit chip connects to the hologram elements of the first hologram chip. In some embodiments, bonding a second plurality of conductive pads on a first region of the control circuit chip to the first plurality of conductive pads of the first hologram chip is via solder bumps. The sub-wavelength hologram elements are integrated with a refractive index tunable core material.

The method 1000 further includes forming a second hologram chip at operation 1018 by repeating operations 1002, 1006, and 1010. The method also includes connecting the second hologram chip to the control circuit chip at operation 1022. The connecting includes bonding the second plurality of conductive pads on a second region of the control circuit chip to the first plurality of conductive pads of the second hologram chip, such that the control circuit chip connects to the hologram elements of the second hologram chip.

Any ranges cited herein are inclusive. The terms "substantially" and "about" used throughout this Specification are used to describe and account for small fluctuations. For example, they can refer to less than or equal to .±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall in between.

What is claimed is:

1. A hologram system comprising:
a hologram chip comprising a wafer substrate having a first plurality of conductive pads on a hologram surface region connected to a second plurality of conductive pads on an interconnect surface region and an array of sub-wavelength hologram elements integrated with a refractive index tunable core material on the hologram region of the wafer substrate; and a control circuit chip having a third plurality of conductive pads connected to the second plurality of conductive pads on the interconnect region of the wafer substrate, wherein the interconnect region is on the same side of the wafer substrate as the hologram region, and wherein the first plurality of conductive pads are directly connected to the array of sub-wavelength hologram elements.

2. The hologram system of claim 1, wherein the array of sub-wavelength hologram elements is a plurality of nano-walls arranged in a one-dimensional array, and the plurality of nano-walls is respectively coupled to the first plurality of conductive pads.

3. The hologram system of claim 1, wherein the first plurality of conductive pads is connected to the second plurality of conductive pads by an interconnecting wire bus.

4. The hologram system of claim 1, wherein the second plurality of conductive pads is connected to the third plurality of conductive pads via solder bumps.

5. The hologram system of claim 1, wherein the chip is a CMOS chip.

6. The hologram system of claim 1, wherein the wafer substrate comprises silicon.

7. The hologram system of claim 1, wherein each of the first, second, and third plurality of conductive pads comprises a respective first, second, and third plurality of sub-group of conductive pads.

8. The hologram system of claim 6, wherein the first plurality of sub-group of conductive pads are electrically connected to the second plurality of sub-group of conductive pads.

9. The hologram system of claim 7, wherein the second plurality of sub-group of conductive pads are electrically connected to the third plurality of sub-group of conductive pads.

10. A hologram system comprising:
one or more hologram chips, each of the one or more hologram chips comprising an array of sub-wavelength hologram elements integrated with a refractive index tunable core material on a wafer substrate and a plurality of through-vias in the respective wafer substrates;
an interposer positioned under the one or more hologram chips and electrically coupled to the one or more hologram chips; and
a control circuit chip disposed on the top of the interposer, the control circuit chip electrically connected to the one or more arrays of sub-wavelength hologram elements through the respective plurality of through-vias in each of the one or more respective wafer substrates for the one or more hologram chips,
wherein each of the one or more respective wafer substrates are positioned between the interposer and the one or more arrays of sub-wavelength holograph elements.

11. The hologram system of claim 9, wherein the one or more respective wafer substrates comprise silicon.

12. The hologram system of claim 9, wherein the one or more arrays of sub-wavelength hologram elements are aligned with each other.

13. The hologram system of claim 9, wherein the one or more respective wafer substrates are in a square shape or a rectangular shape.

14. The hologram system of claim 13, wherein the control circuit chip is a CMOS chip.

15. The hologram system of claim 9, wherein the interposer comprises a first plurality of conductive pads in a hologram region and a second plurality of conductive pads in an interconnect region, wherein the first plurality of conductive pads are connected to the second plurality of pads in the interposer, and wherein the first plurality of conductive pads comprising one or more subsets of conductive pads.

16. The hologram system of claim 14, wherein each of the one or more hologram chips having a third plurality of conductive pads connected between the plurality of silicon through vias and the respective subset of the first plurality of conductive pads in the hologram region, such that one or more arrays of sub-wavelength hologram elements are electrically coupled to the plurality of conductive pads on the hologram region of the interposer.

17. The hologram system of claim 14, wherein the second plurality of conductive pads on the interposer is connected to a fourth plurality of pads of the control circuit chip.

18. The hologram system of claim 14, wherein the first plurality of conductive pads and second plurality of conductive pads are near the edge of the respective region of the interposer.

19. The hologram system of claim 9, wherein the one or more arrays of sub-wavelength hologram elements comprise a plurality of nano-walls arranged in a one-dimensional array, and the plurality of nano-walls is respectively coupled to the first plurality of conductive pads.

20. The hologram system of claim 9, wherein the first plurality of conductive pads is connected to the second plurality of conductive pads by an interconnecting wire bus.

21. The hologram system of claim 9, wherein the second plurality of conductive pads is connected to the fourth plurality of conductive pads via solder bumps, wherein the one or more subsets of first plurality of conductive pads are connected to the respective third plurality of conductive pads via solder bumps.

* * * * *